(12) United States Patent
Marumoto

(10) Patent No.: US 10,847,387 B2
(45) Date of Patent: Nov. 24, 2020

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventor: Hiroshi Marumoto, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 325 days.

(21) Appl. No.: 16/026,285

(22) Filed: Jul. 3, 2018

(65) Prior Publication Data

US 2019/0013217 A1 Jan. 10, 2019

(30) Foreign Application Priority Data

Jul. 4, 2017 (JP) .................................. 2017-131473

(51) Int. Cl.
*F26B 5/04* (2006.01)
*H01L 21/67* (2006.01)
*H01L 21/687* (2006.01)

(52) U.S. Cl.
CPC .... *H01L 21/67034* (2013.01); *H01L 21/6715* (2013.01); *H01L 21/67051* (2013.01); *H01L 21/68764* (2013.01)

(58) Field of Classification Search
CPC .. F26B 5/04; H01L 21/67034; H01L 21/6715; H01L 21/68764; H01L 21/67051; B08B 3/02

USPC ............................ 34/340, 342, 357, 329, 337
See application file for complete search history.

(56) References Cited

U.S. PATENT DOCUMENTS

| 8,337,659 B2* | 12/2012 | Orii ......................... F26B 5/005 156/345.21 |
| 2007/0017555 A1* | 1/2007 | Sekiguchi ............... B08B 3/024 134/33 |
| 2014/0231012 A1* | 8/2014 | Hinode ............. H01L 21/67248 156/345.23 |
| 2017/0178892 A1* | 6/2017 | Sato ................... H01L 21/67109 |
| 2019/0198363 A1* | 6/2019 | Shimai .............. H01L 21/68707 |

FOREIGN PATENT DOCUMENTS

JP 2007-036180 A 2/2007

* cited by examiner

*Primary Examiner* — John P McCormack
(74) *Attorney, Agent, or Firm* — Pearne & Gordon LLP

(57) ABSTRACT

A method of drying a substrate after processing the substrate with a processing liquid (e.g., DIW) includes drying the substrate by moving, after forming a liquid film by supplying a first drying liquid (e.g., IPA) having higher volatility than the processing liquid onto the substrate W, a supply position P1 of the first drying liquid such that a distance R1 from a rotation center O of the substrate to the supply position P1 of the first drying liquid is gradually increased, while rotating the substrate, to expand a dry region DC in a concentric shape. The drying of the substrate comprises supplying a second drying liquid onto the substrate while supplying the first drying liquid. A distance R2 from the rotation center to a supply position P2 of the second drying liquid is larger than the distance R1 from the rotation center to the supply position P1.

13 Claims, 4 Drawing Sheets

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2017-131473 filed on Jul. 4, 2017, the entire disclosures of which are incorporated herein by reference.

TECHNICAL FIELD

The embodiments described herein pertain generally to a technique of drying a substrate such as a semiconductor wafer after processing the substrate with a processing liquid.

BACKGROUND

A manufacturing process of a semiconductor device includes a process of performing a liquid processing such as wet etching or chemical liquid cleaning by supplying a chemical liquid from a nozzle onto a surface of a substrate such as a semiconductor wafer. After the chemical liquid is supplied, a rinse liquid such as DIW (pure water) is supplied onto the substrate, and, then, the substrate is dried.

Patent Document 1 discloses a technique in which IPA, which is a liquid having high volatility and low surface tension, is supplied to a central portion of a surface of a substrate which is wet with the DIW, and a supply position of the IPA is then moved from the central portion of the substrate toward a periphery thereof. Accordingly, a drying interface (which refers to an interface between a dry region where the IPA is dried to be removed and a non-dry region where a liquid film of the IPA exists) is gradually expanded toward the periphery of the substrate and the surface of the substrate is dried. By performing the drying processing in this way, it is possible to suppress a problem such as particle generation, pattern collapse, or the like in the drying processing. Further, it is described in Patent Document 1 that a nitrogen gas is supplied to the dry region on the surface of the substrate at the same time when the IPA is supplied. A supply position of the nitrogen gas may be moved from the central portion of the substrate toward the periphery thereof such that the nitrogen gas is discharged to a slightly inner position than the drying interface in a radial direction. By supplying this nitrogen gas, the drying processing is accelerated and uniformed.

Recently, however, in the manufacture of a recent semiconductor device which is highly integrated and has a high aspect ratio, pattern collapse occurs even if the aforementioned method is used. As a way to avoid the pattern collapse, sublimation drying or supercritical drying may be considered. These drying methods, however, are highly costly. Furthermore, recently, a criterion for a defect such as an IPA residue is getting stricter, and this criterion may not be met in the aforementioned method.

Patent Document 1: Japanese Patent Laid-open Publication No. 2007-036180

SUMMARY

In view of the foregoing, exemplary embodiments provide a technique of drying a substrate capable of suppressing a damage of a liquid film on a surface of the substrate while optimizing a drying condition at a drying interface.

In one exemplary embodiment, a substrate processing method includes processing a substrate with a processing liquid; and drying the substrate by moving, after forming a liquid film by supplying a first drying liquid having higher volatility than the processing liquid onto the substrate being rotated, a supply position of the first drying liquid such that a distance from a rotation center of the substrate to the supply position of the first drying liquid on the substrate is gradually increased, to expand a dry region in a concentric shape. The drying of the substrate comprises supplying a second drying liquid having higher volatility than the processing liquid onto the substrate while supplying the first drying liquid onto the substrate. A distance from the rotation center of the substrate to a supply position of the second drying liquid on the substrate is larger than the distance from the rotation center of the substrate to the supply position of the first drying liquid.

In another exemplary embodiment, a substrate processing apparatus includes a substrate holding unit configured to hold a substrate horizontally; a rotating mechanism configured to rotate the substrate holding unit around a vertical axis; a processing liquid nozzle configured to supply a processing liquid onto a surface of the substrate held by the substrate holding unit; a first drying liquid nozzle configured to supply a first drying liquid configured to dry the substrate; a second drying liquid nozzle configured to supply a second drying liquid configured to dry the substrate; a processing liquid supply mechanism configured to supply the processing liquid to the processing liquid nozzle; a first drying liquid supply mechanism configured to supply the first drying liquid to the first drying liquid nozzle; a second drying liquid supply mechanism configured to supply the second drying liquid to the second drying liquid nozzle; a nozzle moving mechanism configured to horizontally move the processing liquid nozzle, the first drying liquid nozzle and the second drying liquid nozzle; and a control unit configured to control the processing liquid supply mechanism, the first drying liquid supply mechanism, the second drying liquid supply mechanism and the nozzle moving mechanism to perform a substrate processing method.

In yet another exemplary embodiment, there is provided a computer-readable recording medium having stored thereon computer-executable instructions that, in response to execution, cause a substrate processing apparatus to perform a substrate processing method.

According to the exemplary embodiments, by supplying the drying liquid from the second drying liquid nozzle, the damage of the liquid film of the drying liquid on the surface of the substrate can be suppressed. Therefore, the supply condition for the drying liquid from the first drying liquid nozzle can be decided only in consideration of optimization of the state of the drying liquid in the vicinity of the drying interface.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
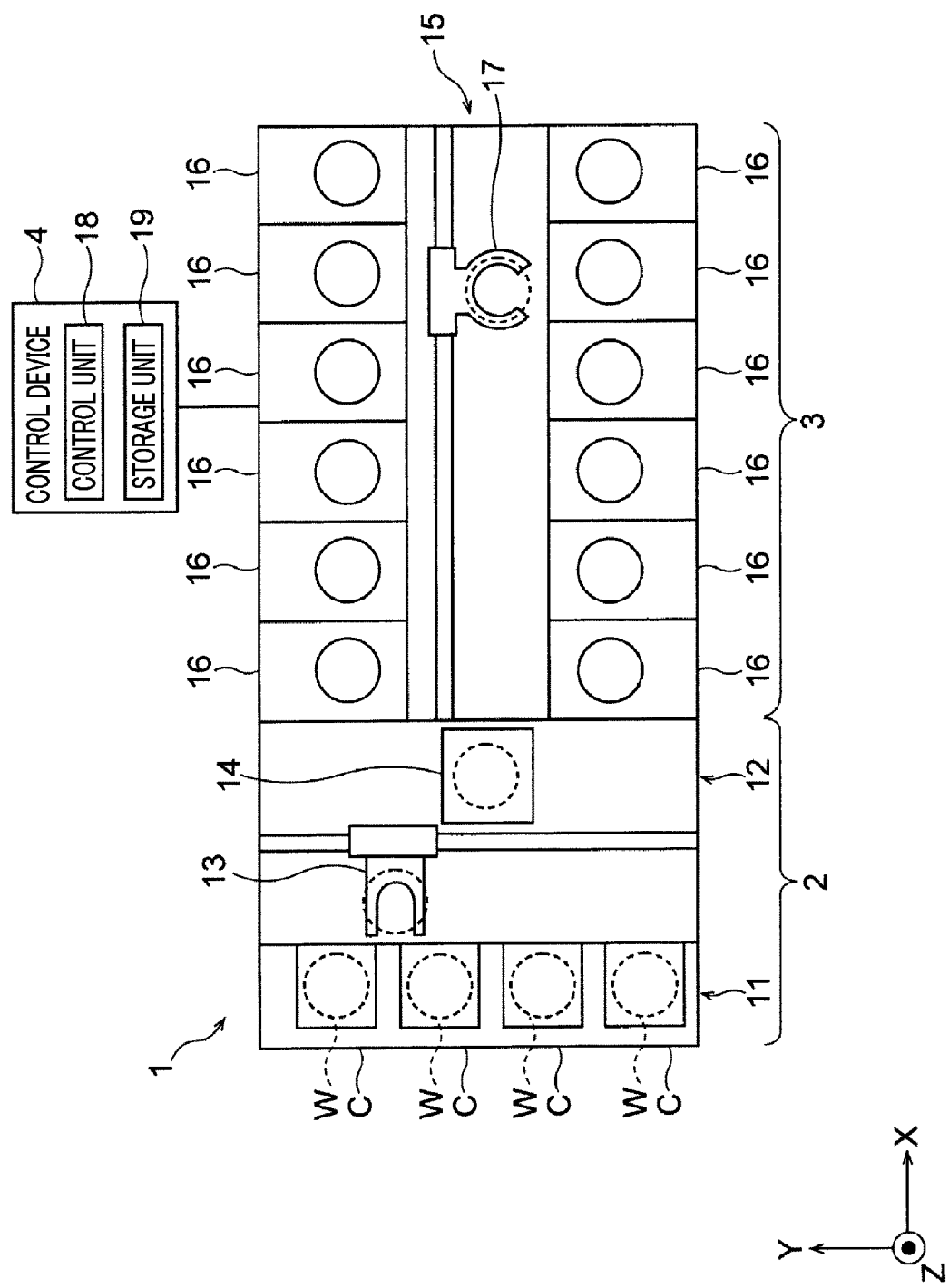
FIG. 1 is a plan view illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be explained in detail with reference to the accompanying drawings.

FIG. 1 is a plan view illustrating an outline of a substrate processing system provided with a processing unit according to an exemplary embodiment. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
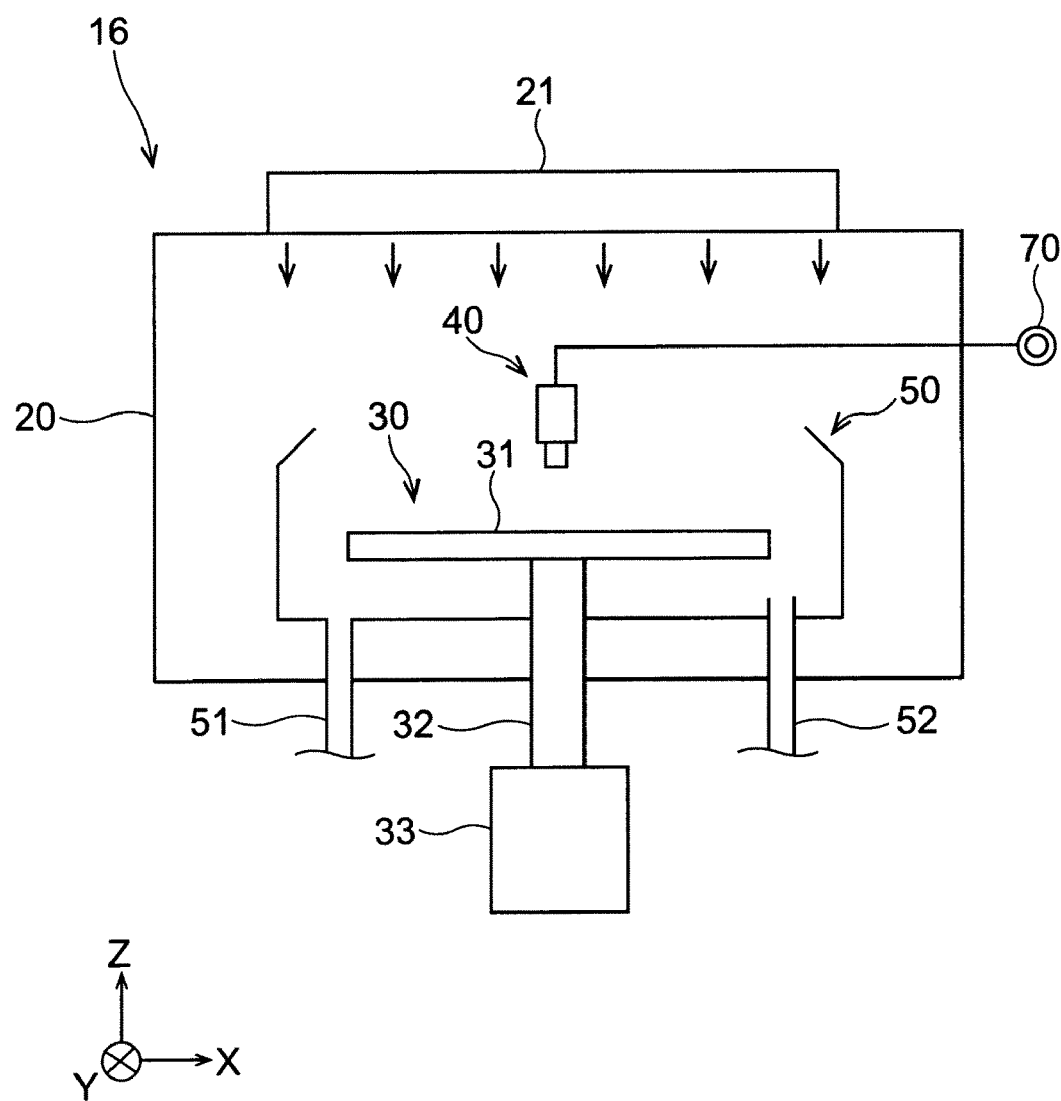
FIG. 2 is a longitudinal cross sectional view illustrating a schematic configuration of a processing unit belonging to the substrate processing system.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on a ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
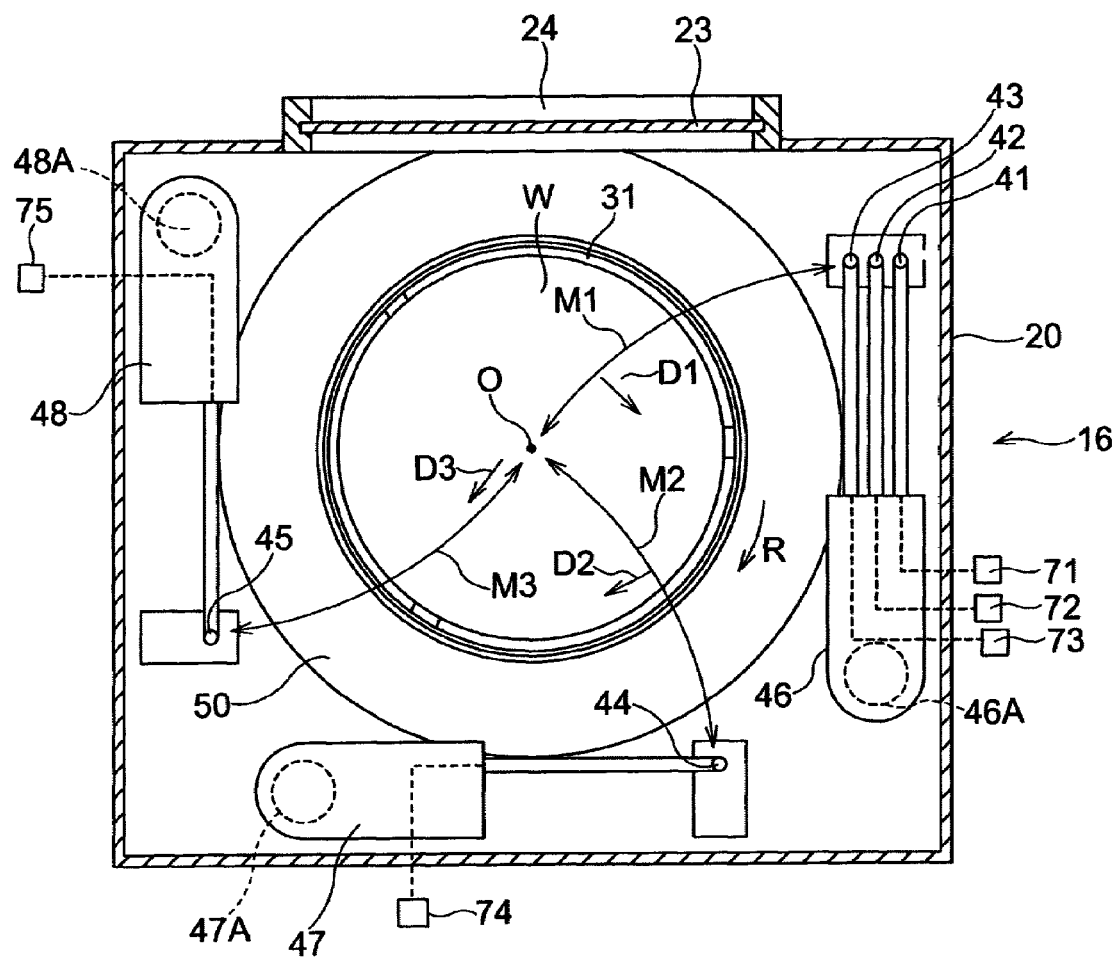
FIG. 3 is a plan view illustrating the inside of the processing unit shown in FIG. 2.

As depicted in FIG. 3, the processing unit 16 is equipped with a chemical liquid nozzle 41 configured to supply DHF (dilute hydrofluoric acid) as a chemical liquid onto the wafer W; a rinse nozzle 42 configured to supply DIW (pure water) as a rinse liquid onto the wafer W; a first drying liquid nozzle 43 configured to supply IPA (isopropyl alcohol) as a drying liquid onto the wafer W; a second drying nozzle 44 configured to supply the IPA (Isopropyl Alcohol) as the drying liquid onto the wafer W; a gas nozzle 45 configured to supply an inert gas (in the present exemplary embodiment, a nitrogen gas) as a drying gas onto the wafer W. These nozzles 41 to 45 are schematically illustrated as the processing fluid supply unit 40 in FIG. 2.

The chemical liquid nozzle 41, the rinse liquid nozzle 42 and the first drying liquid nozzle 43 are mounted to a first nozzle arm 46. The first nozzle arm 46 is configured to be movable up and down and pivotable around the vertical axis by an elevating/rotating mechanism 46A. The first nozzle arm 46 is capable of moving the chemical liquid nozzle 41, the rinse nozzle 42 and the first drying liquid nozzle 43 above the wafer W as indicated by an arrow M1. The second drying liquid nozzle 44 is mounted to a second nozzle arm 47 configured to be movable up and down and pivotable around the vertical axis by an elevating/rotating mechanism 47A, and, thus, the second drying liquid nozzle 44 is movable above the wafer W along an arrow M2. The gas nozzle 45 is provided at a third nozzle arm 48 configured to be movable up and down and pivotable around the vertical axis by an elevating/rotating mechanism 48A, and is movable above the wafer W along an arrow M3.

The first drying liquid nozzle 43 is provided at the first nozzle arm 46 to discharge the drying liquid obliquely downwards. To elaborate, when the first drying liquid nozzle 43 is viewed from directly above, the drying liquid is discharged from the first drying liquid nozzle 43 in a direction (indicated by an arrow D1 of FIG. 3) which corresponds to a rotational direction (indicated by an arrow R of FIG. 3) of the wafer W. By configuring the first drying liquid nozzle 43 in this way, a splash of the liquid can be suppressed when the drying liquid discharged from the first drying liquid nozzle 43 arrives on the surface of the wafer W.

The second drying liquid nozzle 44 is provided at the second nozzle arm 47 to discharge the drying liquid obliquely downwards. To elaborate, when the second drying liquid nozzle 44 is viewed from directly above, the drying liquid is discharged from the second drying liquid nozzle 44 in a direction (indicated by an arrow D2 of FIG. 3) which corresponds to the rotational direction (indicated by the arrow R of FIG. 3) of the wafer W. By configuring the second drying liquid nozzle 44 in this way, the splash of the liquid can be suppressed when the drying liquid discharged from the second drying liquid nozzle 44 arrives on an IPA liquid film (originated from the IPA discharged from the first drying liquid nozzle 43) on the surface of the wafer W.

The chemical liquid nozzle 41 and the rinse nozzle 42 are mounted to the first nozzle arm 46 to discharge the liquids in the same direction as the first drying liquid nozzle 43. However, the chemical liquid nozzle 41 and the rinse nozzle 42 may be mounted to the first nozzle arm 46 to discharge the liquids vertically downwards.

The gas nozzle 45 is provided at the third nozzle arm 48 to discharge the drying gas obliquely downwards. To elaborate, when the gas nozzle 45 is viewed from directly above, the drying gas is discharged from the gas nozzle 45 in a direction (indicated by an arrow D3 of FIG. 3) which corresponds to a radial direction of the wafer W. By configuring the gas nozzle 45 in this way, a dry core formed at the wafer W can be efficiently expanded.

The chemical liquid nozzle 41 is connected to a chemical liquid supply mechanism 71; the rinse nozzle 42, a rinse liquid supply mechanism 72; the first drying liquid nozzle 43, a first drying liquid supply mechanism 73; the second drying liquid nozzle 44, a second drying liquid supply mechanism 74; the gas nozzle 45, a gas supply mechanism 75. Though detailed illustration is omitted, each of the supply mechanisms 71 to 75 is equipped with: a supply source (a tank, a factory power supply source, and so forth) for the corresponding processing fluid (the chemical liquid, the rinse liquid, the drying liquid or the drying gas); a pipeline connecting each supply source to the corresponding one of the nozzles 41 to 45; an opening/closing valve provided at the corresponding pipeline; and a flow rate controller such as a flowrate control valve. The supply mechanisms respectively supply the processing fluids to the corresponding nozzles 41 to 45 at controlled flow rates.

Since the IPA used as the drying liquid in the present exemplary embodiment has miscibility with the DIW which constitutes the rinse liquid, it can easily replace the DIW. Further, since the IPA has higher volatility than the DIW, it can be easily dried. Therefore, the IPA can be appropriately used as the drying liquid. Further, since the IPA has lower surface tension than the DIW, collapse of a fine pattern having a high aspect ratio can be suppressed. The drying liquid, however, is not limited to the IPA, and another organic solvent having the above-stated characteristics, for example, HFO (hydrofluoroolefin) or HFE (hydrofluoroether) may be used as the drying liquid.

The nitrogen gas used as the drying gas in the present exemplary embodiment has a low oxygen concentration and a low humidity, and is effective in suppressing generation of a defect such as a water mark on the surface of the wafer. Alternatively, another inert gas such as an argon gas may be used as the drying gas.

Now, an operation of the above-described substrate processing apparatus will be explained. The following operation is controlled through control signals generated by the control unit 18 as the program stored in the storage unit 19 of the control device 4 is executed.

First, a shutter 23 (FIG. 3) provided at one sidewall of the chamber 20 is opened, and the wafer W held by a non-illustrated transfer arm (an arm of the substrate transfer device 17 of FIG. 1) is carried into the chamber 20 through a carry-in/out opening 24. Then, the wafer W is handed over to the holding unit 31 (a part of which is seen around the wafer W in FIG. 3) of the substrate holding mechanism 30 from the transfer arm, and is held horizontally by the holding unit 31.

[Chemical Liquid Processing]

Then, the chemical liquid nozzle 41 is moved to a position directly above a central portion of the wafer W by the first nozzle arm 46. Further, the holding unit 31 holding the wafer W thereon is rotated by the driving unit 33 of the substrate holding mechanism 30, so that the wafer W is rotated around the vertical axis. In this state, the DHF fed to the chemical liquid nozzle 41 by the chemical liquid supply mechanism 71 is supplied to the central portion of the surface of the wafer W from the chemical liquid nozzle 41. The supplied DHF is flown on the surface of the wafer W while being diffused toward a periphery of the wafer W by a centrifugal force, so that a chemical liquid processing is performed on the wafer W in the state that a liquid film of the DHF is formed on the surface of the wafer W. The wafer W is continuously rotated until a drying processing to be described later is completed.

[Rinsing Processing]

After the chemical liquid processing is performed for a preset time period, the supply of the DHF from the chemical liquid nozzle 41 is stopped, and, at the substantially same time, the DIW fed to the rinse nozzle 42 by the rinse liquid supply mechanism 72 is supplied to the central portion of the surface of the wafer W from the rinse nozzle 42. The supplied DIW is flown on the surface of the wafer W while being diffused toward the periphery of the wafer W by the centrifugal force, so that a rinsing processing is performed on the wafer W in the state that a liquid film of the DIW is formed on the surface of the wafer W.

[Drying Processing]

Now, the drying processing will be explained. Further, for the convenience of explanation hereinafter, arrival points P1 and P2 of the IPA respectively discharged from the first and second drying liquid nozzles 43 and 44 onto the surface of the wafer W (these points substantially coincide with points of intersection between axes of discharging openings of these nozzles and the surface of the wafer W), or distances R1 and R2 of these arrival points P1 and P2 from a rotation center O of the wafer W may sometimes be used as indices indicating the positions of the first and second drying liquid nozzles 43 and 44, respectively. Further, a gas collision point Pg, which is a position on the surface of the wafer W with which a mainstream of the gas discharged from the gas nozzle 45 collides (this point substantially coincides with a point of intersection between an axis of a discharging opening of this nozzle and the surface of the wafer W), or a distance Rg of the gas collision point Pg from the rotation center O of the wafer W may be used as an index indicating the position of the gas nozzle 45.

After the rinsing processing is performed for a predetermined time period, the discharge of the DIW from the rinse nozzle 42 is stopped, and, at the substantially same time, the IPA fed to the first drying liquid nozzle 43 by the first drying liquid supply mechanism 73 is supplied onto the central portion of the surface of the wafer W from the first drying liquid nozzle 43 (the distance R1 at this time is substantially zero). The supplied IPA is flown on the surface of the wafer W while being diffused toward the periphery of the wafer W by the centrifugal force, so that the DIW on the surface of the wafer W is replaced by the IPA, and the surface of the wafer W is covered with a liquid film of the IPA.

Further, at the same time as the supply of the IPA from the first drying liquid nozzle 43 is begun or at an appropriate timing after this supply is begun, the IPA is supplied from the second drying liquid supply mechanism 74 to the second drying liquid nozzle 44 which already stands by at a supply position above the wafer W. The IPA is then discharged from the second drying liquid nozzle 44 toward the arrival point P2 located at an outer side than the central portion of the surface of the wafer W in the radial direction (at this time, the distance R2 is larger than the distance R1 (R2>R1)). The IPA supplied from the second drying liquid nozzle 44 joins the flow of the IPA which forms the liquid film on the surface of the wafer W after being supplied from the first drying liquid nozzle 43. Accordingly, a thicker liquid film of the IPA is formed at a surface of the wafer W at an outer side than the arrival point P2 of the IPA supplied from the second drying liquid nozzle 44 in the radial direction.

After the DIW on the surface of the wafer W is replaced by the IPA and the surface of the wafer W is covered with the liquid film of the IPA, the arrival point P1 of the drying liquid from the first drying liquid nozzle 43 is moved outwards in the radial direction by moving the first drying liquid nozzle 43. If the arrival point P1 is distanced apart from the center (rotation center) O of the wafer as the first drying liquid nozzle 43 is begun to be moved, the gas nozzle 45 is moved to the vicinity of a position directly above the central portion of the wafer, and the nitrogen gas is discharged from the gas nozzle 45 toward the central portion of the wafer W (at this time, the distance R1 is larger than the distance Rg (R1>Rg)). Accordingly, a circular dry core DC is formed at the central portion of the surface of the wafer W. Since this dry core DC is formed by the centrifugal force applied to the IPA even though the nitrogen gas is not discharged toward the central portion of the wafer W from the gas nozzle 45, it may be possible to supply, after the dry core is formed, the nitrogen gas from the gas nozzle 45 onto the dry core DC formed on the surface of the wafer W.

Figure 4:
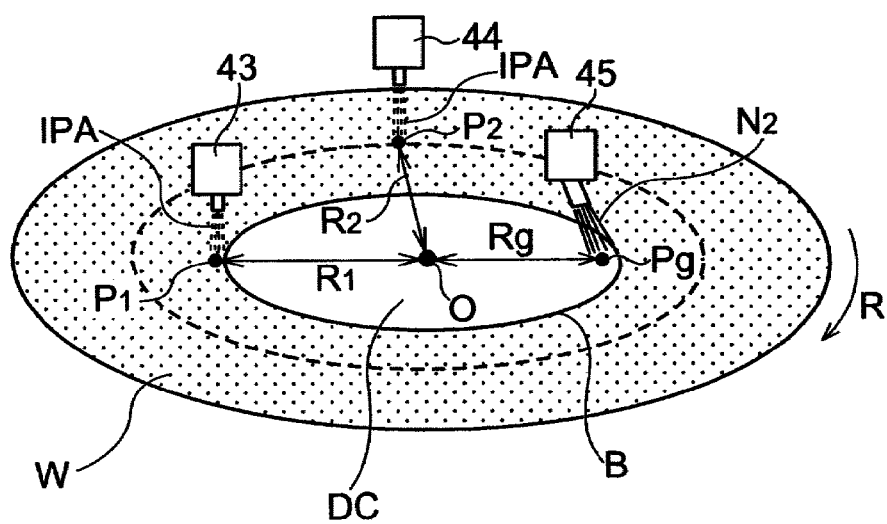
FIG. 4 is a schematic diagram for describing a drying processing.

Hereinafter, in this specification, a boundary between the dry core DC (a dry region from which the IPA is already removed) and a region outside the dry region where the IPA liquid film still exists will be referred to as "drying interface," and this drying interface is indicated by a reference numeral B in FIG. 4.

After the dry core DC is formed, the dry core is concentrically expanded outwardly in the radial direction by moving the first drying liquid nozzle 43 and the gas nozzle 45 outwards in the radial direction, so that the entire surface of the wafer W is finally dried. Here, it may be desirable to move the gas nozzle 45 such that the position of the gas collision point Pg of the gas supplied from the gas nozzle 45 exists at a slightly inner side than the drying interface B in the radial direction. Further, the first drying liquid nozzle 43 and the gas nozzle 45 can be moved outwards in the radial direction such that a value of distance R1−distance Rg is maintained constant.

While moving the first drying liquid nozzle 43 and the gas nozzle 45 outwards in the radial direction, the second drying liquid nozzle 44 is also moved outwards in the radial direction. At this time, during a time period until the gas nozzle 45 reaches a position directly above an edge of the wafer W (that is, during a time period until the distance Rg is equal to the radius of the wafer W), a relationship of distance R2>distance R1>distance Rg is maintained. Further, it may be also possible to move the first drying liquid nozzle 43 and the second drying liquid nozzle 44 outwards in the radial direction while maintaining constant a value of distance R2−distance R1.

Now, operations of the first drying liquid nozzle 43, the second drying liquid nozzle 44 and the gas nozzle 45 while expanding the dry core will be described in detail.

Figure 5:
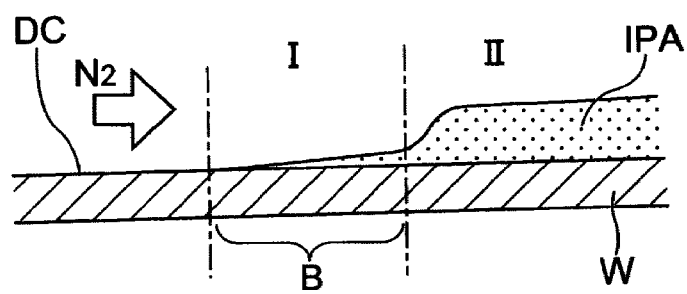
FIG. 5 is a schematic diagram illustrating a state in the vicinity of a drying interface on a surface of a wafer.

FIG. 5 illustrates a state in the vicinity of the drying interface B. A left side of FIG. 5 is a center side of the wafer W on which the dry core DC is formed, and a right side thereof is a peripheral side of the wafer W. In a region I, the liquid film of the IPA is very thin, and this thin film of the IPA on the region I may be regarded as an interface layer. Since the IPA is extended on the wafer W due to its viscosity, a relative velocity of the IPA with respect to the wafer W is very low. Accordingly, the IPA on the region I is removed by evaporation, not by being moved outwards by the centrifugal force. Meanwhile, in a region II, since a thickness of the liquid film is relatively large, the IPA constituting an upper portion of the liquid film on the region II is moved to the peripheral side at a relatively high velocity with respect to the wafer W by the centrifugal force, and the IPA constituting a lower portion of the liquid film on the region II becomes the region I next time. As stated above, within the region I, the IPA forming the thin film on the surface of the wafer W is evaporated in the state that the relative velocity with respect to the wafer W is very low. Therefore, a drying defect (such as generation of an IPA residue or non-uniform drying) which is accompanied by the evaporation of the IPA may be caused within the region I. To suppress this drying defect, it is desirable to uniform the thickness of the IPA thin film within the region I and increase an evaporation rate thereof, as found out by the present inventor through researches.

To uniform the thickness of the IPA thin film within the region I and increase the evaporation rate, it may be desirable to set a flow rate of the IPA discharged from the first drying liquid nozzle 43 to be small and set a temperature of this IPA to be of a high value (e.g., 70° C.) below a boiling point. If the flow rate of the IPA discharged from the first drying liquid nozzle 43 is high, the film thickness of the IPA liquid film near the drying interface B becomes non-uniform, so that non-uniform drying may be easily caused. Thus, it is desirable to minimize the flow rate of the IPA as long as there is no problem in forming the liquid film thereof. Further, if the temperature of the IPA is set to be high, not only the evaporation rate of the IPA is increased but the surface tension of the IPA is also decreased, which is desirable from the viewpoint of suppressing the pattern collapse as well.

To increase the temperature of the IPA discharged from the first drying liquid nozzle 43, the first drying liquid supply mechanism 73 may be equipped with a heating device for the IPA. As this heating device, a heater provided in the tank as the supply source of the IPA or an inline heater provided at the IPA pipeline may be used. Illustration of the heating device is omitted here.

Meanwhile, if the flow rate of the IPA discharged from the first drying liquid nozzle 43 is set to be small or the temperature thereof is set to be high, there may be a concern that the IPA liquid film may not be maintained on the region at the outer side than the arrival point P1 of the IPA supplied from the first drying liquid nozzle 43 in the radial direction. That is, the IPA liquid film at the periphery of the wafer W may be damaged, resulting in exposure of the surface of the wafer W and generation of the drying defect.

However, according to the present exemplary embodiment, the second drying liquid nozzle 44 supplies the IPA onto the arrival point P2 on the wafer, which is located at an outer side than the arrival point P1 of the IPA from the first drying liquid nozzle 43 in the radial direction. Accordingly, the IPA liquid film at a region outer than the arrival point P2 in the radial direction (that is, a region at an outer side than a dashed-lined circle) is thickened, so that the damage on the IPA liquid film at the periphery of the wafer W can be suppressed. Accordingly, the supply of the IPA from the first drying liquid nozzle 43 can be performed under any required conditions as long as the damage of the IPA liquid film within a ring-shaped region ranging from the arrival point P1 to the arrival point P2 (that is, a ring-shaped region ranging from the drying interface B to the dashed-lined circle) can be suppressed. That is, the flow rate and the temperature of the IPA discharged from the first drying liquid nozzle 43 can be set to appropriate values for the optimization and uniformization of the thickness of the IPA thin film within the region I.

It is desirable that the temperature of the IPA supplied from the second drying liquid nozzle 44 is lower (for example, room temperature) than the temperature of the IPA supplied from the first drying liquid nozzle 43. With this setting of the temperatures, the temperature of the IPA on the region outer than the arrival point P2 of the IPA from the second drying liquid nozzle 44 in the radial direction is lowered, so that the evaporation of the IPA can be suppressed. Therefore, the damage of the IPA liquid film at the periphery of the wafer W can be more securely suppressed. Moreover, the flow rate of the IPA supplied from the second drying liquid nozzle 44 can be reduced, so that the consumption amount of the IPA can be reduced.

According to the exemplary embodiment, the IPA supplied from the first drying liquid nozzle 43 is relatively of a high temperature and a low flow rate, whereas the IPA supplied from the second drying liquid nozzle 44 is relatively of a low temperature and a high flow rate. The flow rate and the temperature of the IPA supplied from the first drying liquid nozzle 43 are set through experiments to values at which the drying is performed within the region I in a desirable way. Then, under the conditions of the flow rate and the temperature of the IPA supplied from the first drying liquid nozzle 43, the flow rate and the temperature of the IPA supplied from the second drying liquid nozzle 44 need to be set through experiments such that the IPA liquid film is not damaged at the periphery of the wafer W.

It is desirable to increase the flow rate of the IPA supplied from the first drying liquid nozzle 43 as the supply position (arrival position P1) of this IPA approaches the periphery of the wafer W. The aforementioned region I is the ring-shaped region, and an area of this region I increases as it goes toward the periphery. Therefore, it is desirable to increase the supply amount of the IPA in order to maintain the supply amount of the IPA per unit area to be uniform.

According to the above-described exemplary embodiment, the two drying liquid nozzles (the first drying liquid nozzle 43 and the second drying liquid nozzle 44) are provided to supply the drying liquid (IPA), and, on the wafer W, the distance R2 from the rotation center O of the wafer W to the arrival point P2 (supply position) of the drying liquid from the second drying liquid nozzle 44 is set to be larger than the distance R1 from the rotation center O of the wafer W to the arrival point P1 (supply position) of the drying liquid from the first drying liquid nozzle 43. Since the damage of the liquid film at the periphery of the wafer W can be suppressed by supplying the drying liquid from the second drying liquid nozzle 44 under the appropriate conditions, the conditions for the supply of the drying liquid from the first drying liquid nozzle 43 can be decided only in consideration of optimal formation of the drying interface. Therefore, the generation of the drying defect can be easily suppressed.

A moving speed of the first drying liquid nozzle 43 may be kept constant or be varied depending on the position of the first drying liquid nozzle 43 in the radial direction (or the distance R1). Likewise, a moving speed of the second drying liquid nozzle 44 may be maintained constant or be varied depending on the position of the second drying liquid nozzle 44 in the radial direction (or the distance R2). A flow rate of the IPA supplied from the second drying liquid nozzle 44 may be maintained constant or be varied depending on the position of the second drying liquid nozzle 44 in the radial direction (or the distance R2). A moving speed of the gas nozzle 45 may be kept constant or be varied depending on the position of the gas nozzle 45 in the radial direction (or the distance Rg). A flow rate of the nitrogen gas supplied from the gas nozzle 45 may be maintained constant or be varied depending on the position of the gas nozzle 45 in the radial direction (or the distance Rg). A positional relationship (e.g., a value of R2−R1, a value of R1−Rg, etc.) between the first drying liquid nozzle 43, the second drying liquid nozzle 44 and the gas nozzle 45 may be maintained constant or be varied.

In the above-stated exemplary embodiment, both the drying liquid (first drying liquid) supplied from the first drying liquid nozzle 43 and the drying liquid (second drying liquid) supplied from the second drying liquid nozzle 44 are the IPA. However, the exemplary embodiment is not limited thereto, and the first drying liquid and the second drying liquid may be different. In this case, since HFO and HFE have lower viscosity and lower surface tension than the IPA, it is desirable to use them as the first drying liquid to suppress the pattern collapse. Meanwhile, since the HFO and the HFE are of higher price than the IPA, it may be desirable to use the IPA as the second drying liquid which is used only to maintain the liquid film.

Furthermore, the dry core DC may be formed by the centrifugal force applied to the IPA and by the natural drying of the IPA even though the nitrogen gas is not discharged from the gas nozzle 45. Further, the dry core DC can be expanded only by the centrifugal force applied to the IPA liquid film even though the IPA liquid film is not diffused by the nitrogen gas discharged from the gas nozzle 45. Therefore, the supply of the nitrogen gas may not be performed, and in such a case, the gas nozzle 45 can be omitted. Performing the supply of the nitrogen gas, however, is more desirable in the aspect of accelerating the formation of the dry core and the expansion of the dry core.

In addition, the processing target substrate is not limited to the semiconductor wafer W, and various other kinds of substrates such as a glass substrate and a ceramic substrate may be used.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

I claim:

1. A substrate processing method, comprising:
processing a substrate with a processing liquid; and
drying the substrate by moving, after forming a liquid film by supplying a first drying liquid having higher volatility than the processing liquid onto the substrate being rotated, a supply position of the first drying liquid such that a distance from a rotation center of the substrate to the supply position of the first drying liquid on the substrate is gradually increased, to expand a dry region in a concentric shape,
wherein the drying of the substrate comprises supplying a second drying liquid having higher volatility than the processing liquid onto the substrate while supplying the first drying liquid onto the substrate, and
a distance from the rotation center of the substrate to a supply position of the second drying liquid on the substrate is larger than the distance from the rotation center of the substrate to the supply position of the first drying liquid.

2. The substrate processing method of claim 1, wherein the first drying liquid and the second drying liquid have a same component.

3. The substrate processing method of claim 2, wherein the first drying liquid and the second drying liquid are IPA (isopropyl alcohol).

4. The substrate processing method of claim 1, wherein the first drying liquid and the second drying liquid have different component.

5. The substrate processing method of claim 1, wherein a temperature of the first drying liquid when supplying the second drying liquid onto the substrate while supplying the first drying liquid onto the substrate is higher than a temperature of the second drying liquid.

6. The substrate processing method of claim 1, wherein a flow rate of the second drying liquid when supplying the second drying liquid onto the substrate while supplying the first drying liquid onto the substrate is higher than a flow rate of the first drying liquid.

7. The substrate processing method of claim 1, wherein a flow rate of the first drying liquid is increased as the distance from the rotation center of the substrate to the supply position of the first drying liquid on the substrate is increased.

8. The substrate processing method of claim 1, wherein a temperature of the first drying liquid is higher than a temperature of the second drying liquid and a flow rate of the second drying liquid is higher than a flow rate of the first drying liquid when supplying the second drying liquid onto the substrate while supplying the first drying liquid onto the substrate.

9. The substrate processing method of claim 1, wherein the drying of the substrate further comprises supplying a drying gas toward the dry region onto the substrate.

10. The substrate processing method of claim 9, wherein a supply position of the drying gas is moved such that the drying gas is supplied toward a position in a vicinity of an interface between the dry region and a non-dry region at an outside of the dry region.

11. A substrate processing apparatus, comprising:
a substrate holding unit configured to hold a substrate horizontally;
a rotating mechanism configured to rotate the substrate holding unit around a vertical axis;
a processing liquid nozzle configured to supply a processing liquid onto a surface of the substrate held by the substrate holding unit;
a first drying liquid nozzle configured to supply a first drying liquid configured to dry the substrate;
a second drying liquid nozzle configured to supply a second drying liquid configured to dry the substrate;
a processing liquid supply mechanism configured to supply the processing liquid to the processing liquid nozzle;
a first drying liquid supply mechanism configured to supply the first drying liquid to the first drying liquid nozzle;
a second drying liquid supply mechanism configured to supply the second drying liquid to the second drying liquid nozzle;

a nozzle moving mechanism configured to horizontally move the processing liquid nozzle, the first drying liquid nozzle and the second drying liquid nozzle; and a control unit configured to control the processing liquid supply mechanism, the first drying liquid supply mechanism, the second drying liquid supply mechanism and the nozzle moving mechanism to perform a substrate processing method as claimed in claim 1.

12. The substrate processing apparatus of claim 11, further comprising:

a gas nozzle configured to supply a drying gas with which the substrate is dried; and a drying gas supply mechanism configured to supply the drying gas to the gas nozzle, wherein the control unit performs a substrate processing method as claimed in claim 9.

13. A computer-readable recording medium having stored thereon computer-executable instructions that, in response to execution, cause a substrate processing apparatus to perform a substrate processing method as claimed in claim 1.

* * * * *